(12) United States Patent
Gerner

(10) Patent No.: US 6,531,715 B1
(45) Date of Patent: Mar. 11, 2003

(54) MULTILAYER CONTACT ELECTRODE FOR COMPOUND SEMICONDUCTORS AND PRODUCTION METHOD THEREOF

(75) Inventor: Jochen Gerner, Wiesloch (DE)

(73) Assignee: Vishay Semiconductor GmbH, Heilbronn (DE)

(*) Notice: Subject to any disclaimer, the term of this patent is extended or adjusted under 35 U.S.C. 154(b) by 50 days.

(21) Appl. No.: 09/707,811

(22) Filed: Nov. 7, 2000

(30) Foreign Application Priority Data

Nov. 11, 1999 (DE) .......................... 199 54 319

(51) Int. Cl.$^7$ .............................................. H01L 27/15
(52) U.S. Cl. ............................. 257/81; 257/99; 257/80; 257/102
(58) Field of Search .......................... 257/99, 102, 81, 257/80, 79, 103

(56) References Cited

U.S. PATENT DOCUMENTS

| | | | | |
|---|---|---|---|---|
| 5,395,795 A | * | 3/1995 | Hong et al. | 437/190 |
| 5,429,954 A | * | 7/1995 | Gerner | 437/23 |
| 6,309,965 B1 | * | 10/2001 | Matschitsch | 438/653 |

FOREIGN PATENT DOCUMENTS

| | | |
|---|---|---|
| DE | 3200788 | 7/1982 |
| DE | 19820777 | 11/1998 |
| EP | 0584599 | 3/1994 |
| EP | 0952617 | 10/1999 |
| JP | 62-35587 | 2/1987 |
| JP | 0630084125 | 4/1988 |
| JP | 0386775 | 9/1990 |
| JP | 11-1633034 | * 11/1997 |
| JP | 11054843 | 2/1999 |

* cited by examiner

Primary Examiner—Michael S. Lebentritt
Assistant Examiner—Brad Smith
(74) Attorney, Agent, or Firm—W. F. Fasse; W. G. Fasse

(57) ABSTRACT

A multilayer contact electrode for connecting a bonding wire to a p-type surface of a III/V-compound semiconductor is formed by a first metallizing step followed by a tempering step. Then, a second metallized layer of the same metal as the first metal layer is formed on the first layer but tempering of the second layer is avoided. A reliable bonding of a bonding wire to the non-tempered contact electrode is assured. The contact electrode includes a first inner metallized layer that is tempered and covered by a second nontempered metallized layer of the same metal as the first layer.

13 Claims, 2 Drawing Sheets

MULTILAYER CONTACT ELECTRODE FOR COMPOUND SEMICONDUCTORS AND PRODUCTION METHOD THEREOF

PRIORITY CLAIM

This application is based on and claims the priority under 35 U.S.C. §119 of German Patent Application 199 54 319.4, filed on Nov. 11, 1999, the entire disclosure of which is incorporated herein by reference.

FIELD OF THE INVENTION

The invention relates to a method for producing multilayer contact electrodes for compound semiconductors. The invention also relates to such a multilayer contact electrode and to compound semiconductors equipped with such a multilayer contact electrode.

BACKGROUND INFORMATION

Japanese Patent Abstracts Publication JP 11-054843 a, JPO, 1999 discloses a method for producing multilayer contact electrodes for the p-type semiconductor layer of a semiconductor body made of a III/V-compound semiconductor. In the known method first a metallized layer is applied on the p-type semiconductor layer. The metallized layer is then exposed to a heat treatment or tempering at a temperature of 400° C. Thereafter, further layers consisting of different metals including a barrier layer 13 of titanium are applied to the first metallized layer.

Japanese Patent Abstract Publications JP 62-35587 A, E-522, 1987, Vol. 11, No. 212 describes a multilayer contact electrode for a light emitting semiconductor element. A first tempered metallized layer of chromium is first applied to the semiconductor element, whereupon two further layers of germanium and gold are applied to the first layer. In a further step the further layers are etched.

German Patent Publication DE 198 20 777 A1 describes a wire bonding electrode for the surface of a p-type compound semiconductor on the basis of GaN (gallium nitride) which may have a multilayer structure, the uppermost layer of which is made of aluminum or gold.

In the European Patent Publication EP 0,952,617 A1 several different contact electrodes are disclosed for p-type layers of a III/V-compound semiconductor on the basis of InAlGaN.

Japanese Patent Abstract Publication JP 063 00 84 125 A, JPO & Japio 1988, describes a method for producing an electrode with an aluminum layer for a compound semiconductor.

Present FIG. 5 shows a conventional multilayer contact electrode on a semiconductor body 11 according to the prior art. A single layer contact electrode 13 is applied to the backside of the n-type substrate 12 to form a backside contact. A front side contact is formed as a multilayer contact electrode including a metallized layer 16A, a diffusion barrier layer 16B and a bonding pad 16C to be described in more detail below. The metallized layer 16A is either made of a gold alloy or of pure aluminum.

European Patent Publications EP 0,386,775 A1 or EP 0,584,599 A1 discloses the use of gold alloys for contact electrodes. The use of gold alloys for this purpose has the disadvantage that during the tempering of the contact electrode 16 contaminations can diffuse into the gold alloy. This diffusion applies particularly where the semiconductor layer 14 contains gallium which diffuses out of the semiconductor layer 40 into the contact metal surface where the diffused gallium oxidizes. Such oxidization causes substantial problems during wire bonding because the wire bonds do not stick to the oxide layers, whereby many wire connections are faulty and become rejects. In order to prevent the diffusion and oxidation primarily of gallium, it is necessary to provide the surface contact layer with a diffusion barrier, 16B as will be described in more detail below with reference to FIG. 5.

Further disadvantages of gold alloys for the above purpose reside in the fact that the multilayer contact electrode 16 can be structured only in several process steps, thereby using different etching solutions. Such etching procedures, due to their nature, lead to undesirable and hard to control under etching, which means etching of lower layers in the multilayer contact electrode.

The contact electrode 16 made of pure aluminum, although simpler and less expensive in its manufacture, must however be subjected to a thermal treatment at relatively high temperatures in order to form an ohmic contact with the compound semiconductor. The thermal treatment of the aluminum makes the aluminum brittle and on the surface of the contact a film is formed which contains gallium oxide and aluminum oxide as well as hydroxide, whereby the attachment of a bonding wire is again impaired and difficult.

As is known from German Patent Publication DE 32 00 788 C2 or the above mentioned European Patent Publication EP 0,584,599 A 1, it is possible to combine a gold alloy and pure aluminum for the formation of the multilayer contact electrode 16. However, the formation of intermetallic phases lead to a problem of reliability during operation of semiconductor components provided with such gold alloy and pure aluminum combinations. Thus, it is customary to separate the gold or gold alloy from the aluminum by a diffusion barrier 16B made of titanium nitride or a titanium tungsten alloy. The manufacture and subsequent structuring or shaping of a multi-layer contact electrode 16 made of several metals is relatively expensive, particularly due to the need for a diffusion barrier 16B. The production of such a layer is involved and time consuming so that cost increases are unavoidable.

OBJECTS OF THE INVENTION

In view of the above it is the aim of the invention to achieve the following objects singly or in combination:

to provide a method for the production of multilayer contact electrodes applied to a p-type semiconductor layer of a semiconductor body made of a III/V-compound semiconductor in such a way that a simply structured contact electrode is assured and that diffusion problems are avoided without the need for a barrier layer;

to construct the contact electrode in such a way that the contacting or bonding with a bonding wire is assured without any problems and so that a reliable bond results;

to provide a contact electrode, especially structured for a p-type semiconductor layer of a III/V-compound semiconductor; and to provide a multilayer contact electrode that is, subsequently to its manufacture, easily structured or shaped for the intended purpose of wire bonding.

SUMMARY OF THE INVENTION

The multilayer contact electrode is produced according to the invention by first metallizing the p-type surface layer of the III/V-compound semiconductor body and then tempering the first metallized layer, whereupon a second metallized layer is applied which is not tempered and whereby both metallized layers are made of the same material such as pure aluminum, for example.

The finish electrode according to the invention comprises a first tempered metal layer or tempered metallized layer covered by a second untempered metallized or metal layer, and both layers are made of the same metal material.

A semiconductor component according to the invention combines the above defined contact electrode with a semiconductor body having a p-type semiconductor layer and itself is made of a III/V-compound semiconductor selected from the group of gallium arsenide or gallium aluminum arsenide.

The present method of manufacturing the multilayer contact electrode is simple in its nature and therefore the electrode is easily produced in economical ways because the multilayer or the two layers are made of the same metal of which only the first or inner layer is tempered. Furthermore, the need for a diffusion barrier layer has been avoided, which also is an economical advantage.

Another advantage of the invention is seen in that the present contact electrode assures a reliable bonding with a bonding wire. Moreover, the present semiconductor components equipped with the present contact electrode are particularly suitable for the manufacture of diodes for emitting infrared radiation. Such diodes are especially used of the wireless transmission of data or in various types of sensors.

BRIEF DESCRIPTION OF THE DRAWINGS

In order that the invention may be clearly understood, it will now be described in connection with example embodiments, with reference to the accompanying drawings, wherein.

DETAILED DESCRIPTION OF PREFERRED EXAMPLE EMBODIMENTS AND OF THE BEST MODE OF THE INVENTION

Figure 1:
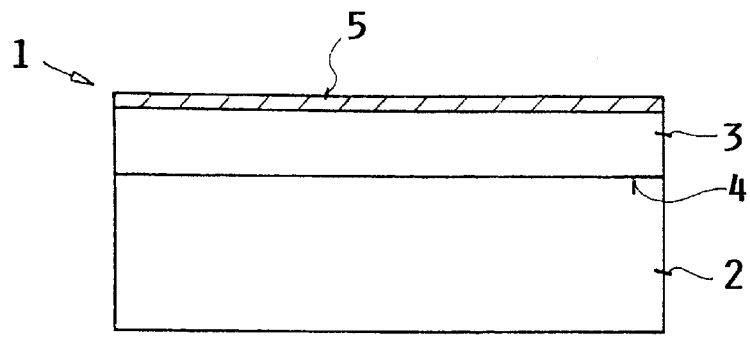
FIG. 1 shows a side view of the layer sequence in a compound semiconductor for an infrared diode with its front side contact layer shown in section.

FIG. 1 shows the layer sequence of a semiconductor body or chip 1 for an infrared diode made of a III/V-mixed crystal or compound semiconductor such as gallium arsenide or gallium aluminum arsenide. The chip 1 has an n-type semiconductor layer 2 and a p-type semiconductor layer 3 which constitutes the radiation emitting surface of the chip 1. A p-n junction 4 is present between the n-type layer 2 and the p-type layer 3. Both semiconductor layers 2 and 3 may be made individually of several different layers. For example, the n-type semiconductor layer 2 may comprise an n-type gallium arsenide substrate and an n-type epitaxial semiconductor layer.

The present method is performed as follows. A first metallized or metal layer 5 of aluminum having a thickness within the range of about 0.01 $\mu$m to about 0.5 $\mu$m is applied to the p-type top surface of the semiconductor layer 3 at a temperature above 350° C. This application may, for example, be made by vapor deposition or cathode sputtering. The first aluminum layer 5 is subjected to a thermal treatment immediately after it has been produced. This thermal treatment takes place at a temperature of about 500° C. for tempering the aluminum of the first layer in an inert atmosphere for about 30 minutes.

In order to provide the required ohmic contact between the aluminum layer 5 and the p-type semiconducting layer 3 with the required low contact resistance, it is necessary that the carrier concentration in the surface of the semiconductor layer 3 is larger than about $1 \times 10^{19}$ carriers per $cm^3$. This concentration of carriers is achieved, for example, in that a high zinc concentration is diffused into the semiconductor layer 3 prior to the application of the aluminum layer 5. Instead of a diffusion process it is possible to dope the semiconductor layer 3 with silicon during the production of the semiconductor layer 3. Alternatively, another suitable element may be doped in high concentration into the semiconductor layer 3.

Figure 2:
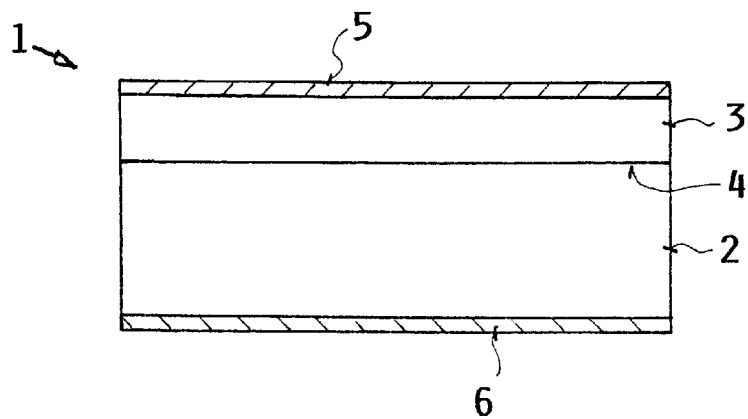
FIG. 2 shows the compound semiconductor according to FIG. 1 additionally provided with a back face contact layer also shown in section.

Following the tempering of the first aluminum layer 5 a single contact electrode 6, the so-called backside contact is applied to the n-type substrate 2 of the chip 1 as seen in FIG. 2. The backside contact electrode 6 is made of a metal film such as a gold germanium alloy as is customary for infrared diodes. The backside contact 6 is applied by way of a known method at a temperature between 360° C. and 450° C. The backside contact electrode 6 already forms during the tempering in this temperature range an ohmic contact with the semiconductor layer 2 forming a substrate for the contact electrode 6. Stated differently, an ohmic contact is established between the substrate or semiconductor layer 2 and the contact electrode 6. The layer must not be exposed to higher temperatures because otherwise the metal film melts onto the semiconductor crystal layer 2 forming a substrate to form an alloy therewith. Therefore, it is necessary that the backside contact electrode 6 is applied and tempered after the formation of the first aluminum layer 8.

Figure 3:
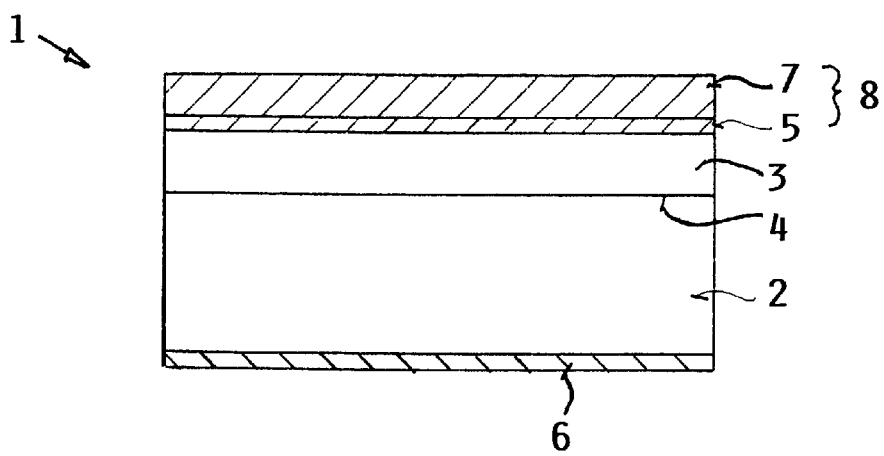
FIG. 3 shows the compound semiconductor according to FIG. 2 additionally provided with a bonding pad on its top surface.

After the formation of the backside contact electrode 6 is completed, the first aluminum layer 5 is briefly etched with a diluted mineral acid such as a diluted hydrofluoric acid (HF) or a buffered hydrofluoroic acid. The etching is completed when all contaminations or coatings have been removed from the surface of the first aluminum layer 5. FIG. 3 shows, when the etching is completed, the formation of a second metallized or metal layer 7 also of aluminum to form a bonding pad having a thickness within the range of 1.5 $\mu$m to 4 $\mu$m, preferably 2 $\mu$m at a temperature of, for example about 150° C. This temperature is kept below a temperature that would constitute a metal treatment of the second aluminum layer 7. In other words, the second aluminum layer 7 is not tempered when it is applied by vapor deposition or sputtering on the etched first aluminum layer 5. It is preferred that the temperature during the application of the second aluminum layer 7 is low enough to avoid a diffusion of contaminations of the first aluminum layer 5 and to avoid that the aluminum of the second layer 7 becomes brittle.

The double layered contact electrode 8 on the front side of the p-type semiconductor layer 3, produced as described above of the two aluminum layers 5 and 7, has the advantage that its production is simple and that the bonding of a bonding wire to the electrode 8 is possible without any faults with a high reliability of the resulting wire bonding. The double layer contact electrode 8 is softer than a single layer contact electrode because the second aluminum layer 7 hardly contains any contaminations. This softness can be determined by a Vickers hardness test. Tests made have shown that the processing window for the wire bonding is substantially larger for the two layer contact electrode 8 of aluminum than it is for a single layer contact electrode. Moreover, it has been found that the two layer contact electrode 8 reliably avoids fractures and shell cracks in the semiconductor crystal while simultaneously assuring a well conducting permanent wire bonding.

Figure 4:
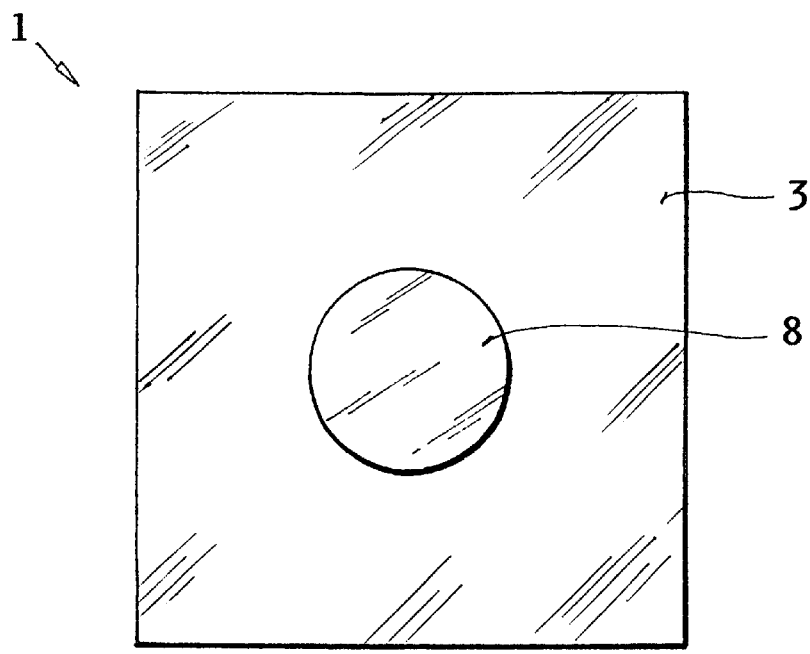
FIG. 4 shows the compound semiconductor according to FIG. 4 after structuring or shaping its top or front side contact electrode.

As shown in FIG. 4, the multilayer contact electrode 8 is structured or shaped after the second aluminum layer 7 has been applied. This structuring or shaping is performed to obtain a maximum or optimal radiation efficiency or power of the radiation emitting surface of the semiconductor body 1, whereby the surface of the semiconductor layer 1 is exposed to leave enough electrode surface sufficient for the wire bonding. During this structuring of shaping unnecessary portions of the multilayer contact electrode 8 are removed by the following procedure. A multitude of chips 1 are arranged on a wafer and a plurality of wafers are simultaneously coated with photoresist mask in a photolithographic manner. After the masking the unnecessary portions of the multi-layer contact electrode 8 are removed by etching with a phosphoric acid having a temperature sufficient for such etching. Alternatively, the etching may be performed by conventional plasma etching methods. As seen in FIG. 4, the contact electrode 8 has a circular shape with a diameter sufficient for the wire bonding.

After the shaping of the electrodes 8 the wafers are covered with a resist or oxide protective coating and then separated, for example by sawing or any other suitable method, into a plurality of semiconductor elements.

Figure 5:
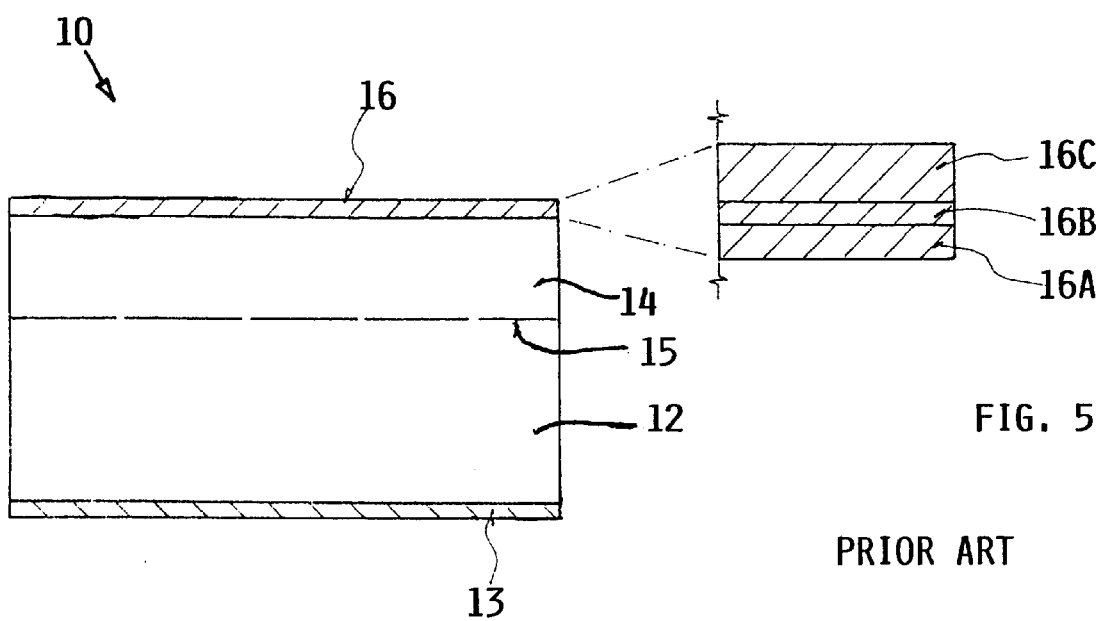
FIG. 5 shows the layer sequence of a compound semiconductor body according to the prior art.

FIG. 5 shows a layer sequence of a semiconductor body or chip 10 according to the prior art. The chip 10 forms an infrared diode through which the current flows vertically between the electrodes 16 and 13. An ohmic contact is formed by back electrode or backside contact 13 that is applied to the backside of an n-type semiconductor layer 12 made of a III/V-mixed crystal or compound semiconductor such as a gallium arsenide (GaAs) or gallium aluminum arsenide (GaAlAs). The application of the back electrode 13 is generally performed by vapor deposition of a metal layer or metallizing made of a gold germanium alloy. On the top surface of the semiconductor layer 12 there is provided a p-type semiconductor layer 14, whereby a p-n junction 15 is formed between the p-type layer 14 and the n-type semiconductor layer 12. On the upper side of the p-type semiconductor layer 14 a further ohmic contact is formed as a multilayer contact electrode 16 made of a gold alloy such as a gold zinc alloy or a gold beryllium alloy or the layer 16 may be made of a pure aluminum. The multilayer contact electrode 16 which has not yet been structured or shaped, has a relatively large thickness within the range of 2 $\mu$m to 3 $\mu$m which is necessary to protect the rather brittle and fracture prone semiconductor material GAs and GaAlAs of the layer 14 against damage during the wire bonding that takes place at high speeds. In order to produce the ohmic contact between the contact electrode 16 and the p-type semiconductor layer 14 it is necessary to apply a temperature treatment to the multilayer contact electrode 16 for the duration of 10 to 30 minutes at a temperature of 400° C. to 500° C. in a nitrogen atmosphere or in an atmosphere of forming gas which is a gas mixture of 85% nitrogen and 15% hydrogen.

The conventional temperature treatment after the formation of the layer 16 causes the diffusion of the metallized layer or at least parts thereof into the semiconductor layer 14 which is undesirable. Additionally, components of the semiconductor layer diffuse into the multilayer contact electrode 16 which is also undesirable. In this context it is a particular problem that the gallium contained in the compound semiconductor body diffuses during the thermal treatment to the surface of the multilayer contact electrode 16 where the gallium oxidizes, which make it very difficult to obtain a well conducting contact bond of a bonding wire with the electrode.

In view of the above it is necessary that the contact electrode 16 is formed of several layers including the metallizing layer 16A of a gold alloy, a diffusion barrier 16B, for example of chromium, titanium or titanium nitride or titanium tungsten alloy and a bonding pad 16C as a basis for attaching the bonding wire. The diffusion barrier 16B makes sure that the bonding pad 16C is not contaminated with components or elements of the semiconductor layer 14 during heat treatment, so that the bonding pad 16C remains well suited for the wire bonding. However, this is achieved only by the separation of the bonding pad 16C from the metallized layer 16A by the diffusion barrier 16B.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A multilayer contact electrode (8) for a p-type semiconductor layer (3) of a semiconductor body (1) made of a III/V-compound semiconductor, said electrode (8) comprising a first tempered aluminum layer (5) and a second non-tempered aluminum layer (7), and wherein said second aluminum layer (7) is a bond pad having a thickness within the range of 1.5 $\mu$m to 4.0 $\mu$m.

2. The multilayer contact electrode (8) of claim 1, wherein said first tempered aluminum layer (5) has a thickness within a range of 0.01 $\mu$m to 0.5 $\mu$m.

3. A method for producing a multilayer contact electrode (8) for a p-type semiconductor layer (3) of a semiconductor body (1) made of a III/V-compound semiconductor according to claim 28, said method comprising the following steps:

(a) first metallizing said p-type semiconductor layer (3) to form a first aluminum layer (5) on said p-type semiconductor layer (3), (b) tempering said first aluminum layer (5) by applying a thermal treatment to said first aluminum layer (5), (c) second metallizing said first aluminum layer (5) to form a second aluminum layer (7) on said first aluminum layer (5) until said second aluminum layer attains a thickness within the range of 1.5 $\mu$m to 4.0 $\mu$m, (d) preventing a thermal treatment of said second aluminum layer (7), and (e) using said second aluminum layer as a bond pad.

4. The method of claim 3, further comprising the step of increasing, prior to said first metallizing step, a carrier concentration in a surface of said p-type semiconductor layer (3) by doping said surface with a member selected from the group of zinc and silicon, and continuing said doping until a concentration of at least $10^{19}$ carriers per cubic centimeter is achieved.

5. The method of claim 3, wherein said first metallizing step is performed by one of vapor deposition and cathodic sputtering at a temperature above 350° until said first aluminum layer (5) reaches a thickness within a range of 0.01 μm to 0.5 μm on said p-type semiconductor layer (3).

6. The method of claim 3, comprising performing said tempering step applied to said first aluminum layer (5) at a temperature of about 500° C. for about 30 minutes immediately following said first metallizing step.

7. The method of claim 3, further comprising etching said first aluminum layer (5) with a diluted mineral acid prior to performing said second metallizing step for forming said second aluminum layer (7).

8. The method of claim 3, wherein said second metallizing step is performed by one of vapor deposition and sputtering at a temperature of about 150° C.

9. The method of claim 3, further comprising structuring said contact electrode (8) including said first aluminum layer (5) and said second aluminum layer (7) for achieving a maximum of radiation efficiency.

10. A combination comprising a semiconductor body (1) made of at least one of gallium arsenide (GaAs) and gallium aluminum arsenide (GaAlAs), a p-type semiconductor layer (3) on said semiconductor body (1), a multilayer contact electrode (8) on said p-type semiconductor layer (3), said multilayer contact electrode (8) comprising a first tempered aluminum layer (5) and a second non-tempered aluminum layer (7), wherein said second non-tempered aluminum layer (7) is a bond pad having a thickness within the range of 1.5 μm to 4.0 μm.

11. The combination of claim 10, wherein said p-type semiconductor layer (3) has a surface with a carrier concentration of at least $10^{19}$ carriers per cubic centimeter.

12. The combination of claim 11, wherein said p-type semiconductor layer (3) is doped in its surface with zinc as a dopant to such an extent that said carrier concentration of at least $10^{19}$ carriers per cubic centimeter is achieved.

13. The combination of claim 11, wherein said p-type semiconductor layer (3) is doped in its surface with silicon as a dopant to such an extent that said carrier concentration of at least $10^{19}$ carriers per cubic centimeter is achieved.

* * * * *

UNITED STATES PATENT AND TRADEMARK OFFICE
CERTIFICATE OF CORRECTION

PATENT NO.    : 6,531,715 B1
DATED         : March 11, 2003
INVENTOR(S)   : Gerner It is certified that error appears in the above-identified patent and that said Letters Patent is hereby corrected as shown below:

<u>Column 4,</u>
Line 42, after "layer", replace "8" by -- 5 --.

Signed and Sealed this

Twenty-ninth Day of April, 2003

JAMES E. ROGAN
*Director of the United States Patent and Trademark Office*